United States Patent
Seshita et al.

(12) 
(10) Patent No.: US 6,366,770 B1
(45) Date of Patent: Apr. 2, 2002

(54) HIGH-FREQUENCY SEMICONDUCTOR DEVICE AND RADIO TRANSMITTER/RECEIVER DEVICE

(75) Inventors: Toshiki Seshita; Mitsuo Konno, both of Kanagawa-Ken (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/268,321

(22) Filed: Mar. 16, 1999

(30) Foreign Application Priority Data

Mar. 16, 1998 (JP) ............................................ 10-065205

(51) Int. Cl.[7] .......................... H01L 23/34; H01L 27/10
(52) U.S. Cl. ...................... 455/277.1; 455/127; 455/83; 257/728; 257/723; 257/724; 257/604; 333/247
(58) Field of Search ................................ 455/83, 277.1; 257/211, 728, 775, 264, 604, 724, 723; 333/247; 485/83

(56) References Cited

U.S. PATENT DOCUMENTS

| | | | |
|---|---|---|---|
| 5,446,425 A | | 8/1995 | Banba |
| 5,450,046 A | * | 9/1995 | Kosugi et al. ............... 333/246 |
| 5,739,560 A | * | 4/1998 | Toyoda et al. ............... 257/211 |
| 5,932,927 A | * | 8/1999 | Koizumi et al. ............. 257/728 |
| 6,009,316 A | * | 12/1999 | Tsuji ........................ 455/277.1 |
| 6,134,424 A | * | 10/2000 | Nishihori et al. ........... 455/127 |

* cited by examiner

*Primary Examiner*—Daniel Hunter
*Assistant Examiner*—Alan T. Gantt
(74) *Attorney, Agent, or Firm*—Oblon, Spivak, McClelland, Maier & Neustadt, P.C.

(57) ABSTRACT

A high-frequency semiconductor device includes a microwave monolithic integrated circuit having first and second passive element sections each having at least one passive element as well as an FET. The FET has a gate connected to the first passive element section and a drain connected to the second passive element section. A bed configured as a plate of a conductive member is provided for mounting thereon the microwave monolithic integrated circuit. The bed has at least one opening or hole formed therethrough. The hole of the bed is provided at a specified position of the bed so as to underlie either one the first or second passive element section. With such an arrangement, it becomes possible to obtain enhanced performance.

25 Claims, 6 Drawing Sheets

HIGH-FREQUENCY SEMICONDUCTOR DEVICE AND RADIO TRANSMITTER/RECEIVER DEVICE

BACKGROUND OF THE INVENTION

1. Field of the Invention

The present invention relates to high-frequency semiconductor devices and radio transmitter/receiver (transceiver) devices.

2. Description of the Related Art

Conventional high-frequency amplifiers for amplification of high-frequency signals at frequencies higher than or equal to 1 gigahertz (GHz) may include a transmitter amplifier adaptable for use in portable and mobile digital cellular radiotelephone terminals based on a currently available personal handy phone (PHP) system—in Japan the acronym "PHS" is more popular, so this acronym will be used hereinafter. An exemplary configuration of such a PHS terminal will be explained as follows.

In such high-frequency amplifiers, a source-grounded or "common-source" amplifier using GaAs metal semiconductor field effect transistors (MESFETs) has been typically employed today. The power gain per stage is approximately 10 decibels (dB), and the use of a serial combination of multiple—two to four—stages of such amplifiers permits the resultant circuitry to have an increased power gain ranging from 20 dB to 40 dB, more or less. This high-frequency amplifier is commercially available for use as a microwave monolithic integrated circuit (MMIC) in a growing electronics market. For reduction of cost penalties, MMICs are typically mounted or "embedded" in plastic packages, which are low-cost housings.

One prior art high-frequency semiconductor device designed for use as a MMIC is shown in FIG. 2. FIG. 2 is a diagram showing a plan view of a MMIC 10 having a high-frequency amplifier circuitry architecture in a four-stage configuration using four MESFETs with sources grounded, where the MMIC 10 is mounted to the frame of a plastic package. The MMIC 10 is put on a metallic plate 2, called a "bed" among those skilled in the art to which the invention pertains.

The MMIC 10 is configured including FETs $12_1, \ldots, 12_4$, matching circuits MC1 to MC4, each of which consists of a capacitor and an inductor, and internal connection pads $14_a$ to $14_1$, $14n$.

The semiconductor device also includes "external" pins 4a–4n along with bonding wires 20a–20n. Pins 4g, 4l, 4m are connected to the bed 2.

One matching circuit MC1 has a capacitor MC1a and an inductor MC1b and is connected to pads 14a, 14h. Another matching circuit MC2 having a capacitor MC2a and an inductor MC2b is connected to a pad 14i. Another matching circuit MC3 is formed of a capacitor MC3a and inductor MC3b and is coupled to a pad 14j. The remaining matching circuit MC4 with a capacitor MC4a and an inductor MC4b is coupled to a pad 14k.

On the other hand, an FET $12_1$ at the initial stage (first-stage FET) has its gate connected to the matching circuit MC1 and its drain connected to the matching circuit MC2 with a source connected to the pad 14b. The second-stage FET $12_2$ has a gate connected to the matching circuit MC2, a drain connected to the matching circuit MC3, and a source coupled to the pad 14c. The third-stage FET $12_3$ has a gate connected to the matching circuit MC3 with a drain coupled to the matching circuit MC4 and with a source coupled to the pad 14e. The fourth-stage FET $12_4$ has its gate connected to the matching circuit MC4 and also coupled via a high resistance element to the pad 14f, a drain coupled to the pad 14n, and a source coupled to the pads 14g, 14l. An output of the high-frequency semiconductor device is derived from the drain node of FET 124, i.e. the pad 14n.

The pads 14a–14f are connected by bonding wires 20a–20f to pins 4a–4f, respectively; pads 14h–14k are connected via bonding wires 20h–20k to pins 4h–4k, respectively. The pad 14g is connected to the bed 2 via three bonding wires 20g, pad 141 is coupled to bed 2 by four bonding wires 201. As the bed is coupled to the grounded power supply in most cases, the pins 4g, 4l, 4m are provided as GND-pins. The pad 14n is tied via the bonding wire 20n to the output pin 4n.

Accordingly, pads 14g, 14l, which are connected to the source of the final-stage FET $12_4$ that is in closest proximity with the source side and thus suffers most significantly from a parasitic inductance problem, are directly connected by bonding wires to the bed 2.

While the bed 2 is typically connected to more than one GND-pin in the way stated above, an inductance does exist at the GND-pins 4g, 4l, 4m shown in FIG. 2, which results in the bed 2 not being set at the "ideal" GND in terms of high-frequency activities. Hereinafter, this GND which is potentially "floating" from the true GND at a certain impedance determinable in terms of high-frequencies will be referred to as a "virtual" GND.

An explanation will next be given of what kinds of problems can occur due to the presence of the virtual GND, rather than the ideal GND. While spiral inductors MC1b, MC2b, MC3b, MC4b are mounted on the MMIC 10 together with metal-insulator-metal (MIM) capacitors MC1a–MC4a, their layout areas are significant to the extent that they occupy a major part of a limited chip area. Hence, a coupling capacitance is present between these elements and the bed with a semiconductor substrate laid or "sandwiched" therebetween.

FIG. 3 is a pictorial representation of the semiconductor device structure to demonstrate how such extra capacitive components reside therein. As shown, a coupling capacitance Cp1 exists between a circuit element 31 in MMIC 10 and its bed 2 whereas another coupling capacitance Cp2 is between an element 32 and bed 2. Because the bed 2 is potentially "floating" in terms of high frequencies as stated previously, the element 31 and element 32 are electrically coupled together via the capacitances Cp1, Cp2. Now, if it is assumed that the bed 2 is completely floating in potential from the true GND in the worst case, the element 31 and element 32 could be coupled together via a series-connected capacitor that is formed by the capacitance components Cp1 and Cp2.

Such an undesirable capacitive coupling between or among certain elements on the MMIC 10 can result in a variety of kinds of malfunctions and operational failures. Especially, in multi-stage amplifier circuitry with a series combination or "cascade" connection of multiple FETs, the element-to-element capacitive coupling can result in serious problems, such as oscillation. An evaluation was done by the present inventors, described herein, which revealed that the most problematic issue lies in capacitive coupling between an input-side matching circuit of the N-th stage FET and an output-side matching circuit of its neighboring, (N+1) th stage FET (where, N is a natural number).

Suppose that an amplifier includes a serial combination of four stages of FETs as shown in FIG. 4. As shown in FIG.

4, four matching circuits MC1, MC2, MC3, MC4 are present between an input stage and output stage of such amplifier. Respective of the matching circuits is configured from a spiral inductor and an MIM capacitor, which can be capacitively coupled together through the bed 2 laid therebetween. For clarity purposes, consider the coupling between the matching circuits MC1, MC3 only, which will be represented as a coupling capacitance Cf.

FIG. 5 shows the stability of the circuitry in FIG. 4, as obtained by simulation. An amplifier tested is of the class with a gain of 40 dB in the 1.9 GHz band. Supposing that the frequency in question as to the stability falls within a range of from 0.1 GHz to 10 GHz; then, it has been investigated how a minimal value (Kmin) of a stability factor K varies depending upon the feedback capacitance Cf in this frequency range. The result is shown in FIG. 5. As is apparent from FIG. 5, when Cf goes beyond 13 femto-farads (fF), the value Kmin becomes less than 1 (i.e., Kmin<1) resulting in dissatisfaction of the absolute stability criteria involved. When Cf further increases to exceed 17 fF, the value Kmin is less than zero (Kmin<0), which results in oscillation in a system of 50-Ohm ($\Omega$) input/output impedance. Incidentally, those inductors and capacitors for use in the MMIC 10 inherently have a capacitance relative to the bed, which capacitance is at least in the order of magnitude of several tens of fF. Thus, there must apparently exist the possibility that the Cf value increases up to about 18 fF or greater, which in turn leads to the creation of a problem that the circuitry is hardly stable in operation. Prior art approaches to achievement of the intended stability are merely to reduce the gain of amplifier circuitry, per se.

Another problem faced with the prior art is that in the case where the MMIC is an oscillator, any desired oscillation frequency is by no means obtainable even in view of the element-to-element or "interelement" capacitance via the bed.

It has been described that prior art high-frequency semiconductor devices are encountered with difficulties in achieving a desired circuit operation unless the inter-element capacitance via the bed is taken into careful consideration, and sometimes faced with a more serious problem as to the inability to attain any desired operation even after consideration of such inter-element capacitance.

The present invention has been made in view of the foregoing technical background, and its primary objective is to provide a new and improved high-frequency semiconductor device with an MMIC capable of achieving increased performance.

SUMMARY OF THE INVENTION

An object of the present invention is to address the above described and other shortcomings of conventional devices. As there are various facets of the present invention, only selected features of the present invention are discussed below in this section of the document. However, a more complete discussion of the present invention is provided in subsequent sections.

In order to achieve the above-described and other objects, a high-frequency semiconductor device is provided with the following features. A microwave monolithic integrated circuit is included and has a circuit element having first and second passive element sections each having at least one passive element, and a transistor with a gate connected to the first passive element section and a drain connected to the second passive element section. A bed is mounted on the microwave monolithic integrated circuit, and is made of a conductive plate having at least one opening. The opening is provided at a position of the bed underlying at least one of the first passive element section and the second passive element section.

It is desirable that the first passive element section be connected to an input side of the transistor whereas the second passive element section be connected to an output side of the transistor.

It is also desirable that the opening be formed at a position of the bed underlying one of the first and second passive element sections which is placed on an input side of the transistor.

It is desirable that the opening be provided at a position of the bed selectively underlying at least one of the first passive element section and the second passive element section.

In addition, a high-frequency semiconductor device in accordance with this invention includes the following features. A microwave monolithic integrated circuit is included that has an amplifier circuit with a cascade connection of a plurality of amplifying elements, each having a matching circuit and a transistor with a gate connected to the matching circuit. A bed is mounted to the microwave monolithic integrated circuit and is made of a conductive plate having at least one opening. It is also desirable that the gate of the transistor be connected to the matching circuit on an input side with a drain of the transistor coupled to the matching circuit on an output side. It is desirable that the opening be formed at a position of the bed underlying at least one of the matching circuit on the input side of one of the amplifying elements with a maximal gain and the matching circuit on the output side thereof. It is desirable that the opening be formed at a position of the bed underlying the matching circuit on the input side of an initial stage one of the amplifying elements. It is desirable that each matching circuit have at least one passive element. Also desirably, the bed selectively has at least one opening under at least one of the matching circuits.

In the respective embodiments stated above, it is desirable that the passive element be at least one of a capacitor and an inductor. It is also desirable that the bed with the microwave monolithic integrated circuit mounted thereon be sealed by a resin material. Further, it is desirable that the microwave monolithic integrated circuit be securely fixed to the bed by use of adhesive made of nonconductive materials.

Furthermore, a radio transmitter/receiver device in accordance with the present invention includes an antenna unit, a high-frequency switch unit for switching between transmission and reception of the antenna unit, a first amplifier unit for amplifying a reception signal sent from the high-frequency switch unit, a receiver circuit unit for processing the amplified reception signal passed from the first amplifier unit, a transmitter circuit unit for sending forth a transmission signal, and a second amplifier unit for amplifying the transmission signal transferred from the transmitter circuit unit and for sending forth the amplified transmission signal toward the high-frequency switch unit.

The above-noted high-frequency semiconductor device is used in at least one of the first amplifier unit and second amplifier unit.

DETAILED DESCRIPTION OF THE PREFERRED EMBODIMENTS

Figure 1A:
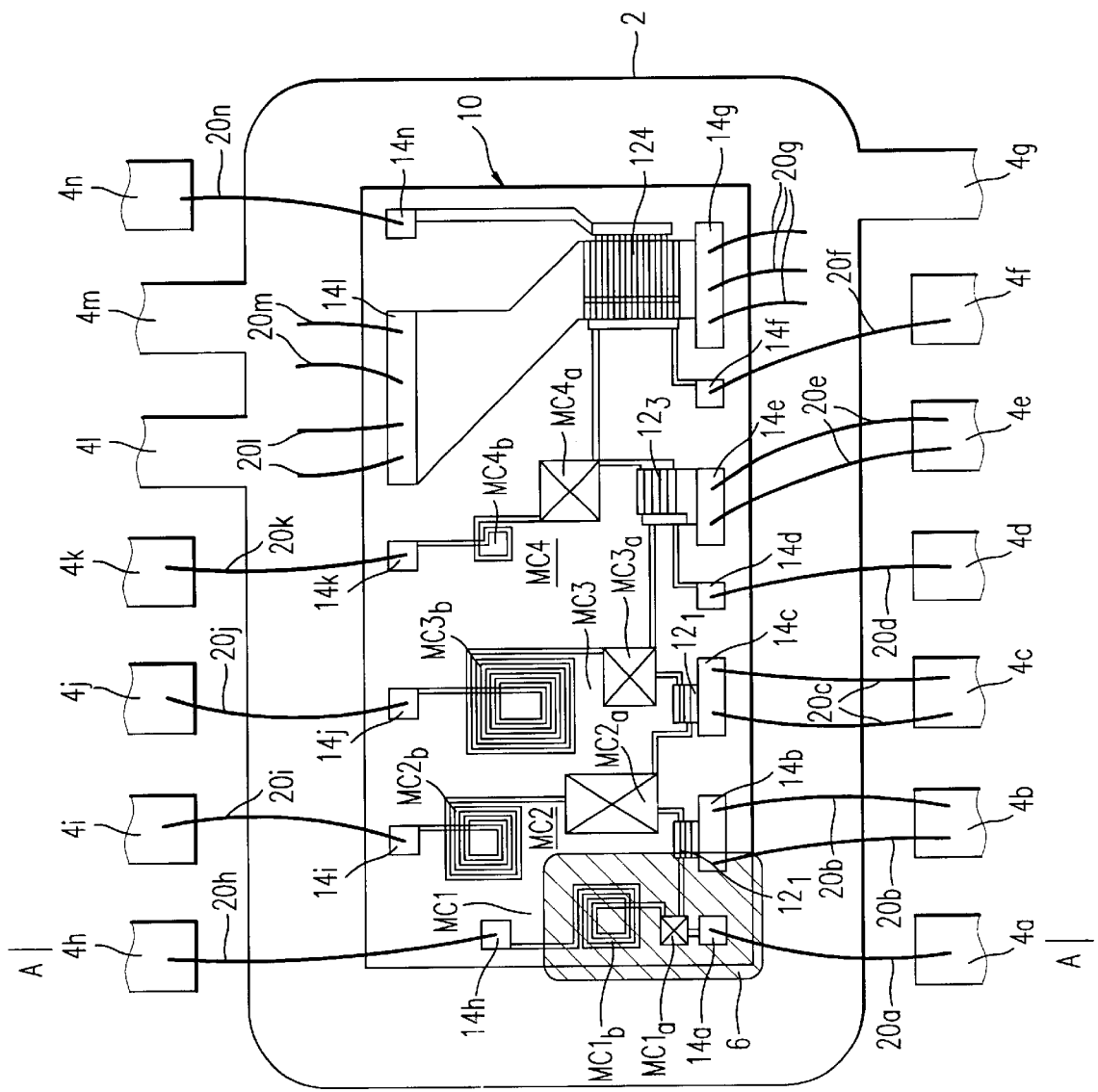
FIG. 1A is a plan view of a structure of a high-frequency semiconductor device in accordance with one preferred embodiment of the present invention.
Figure 1B:
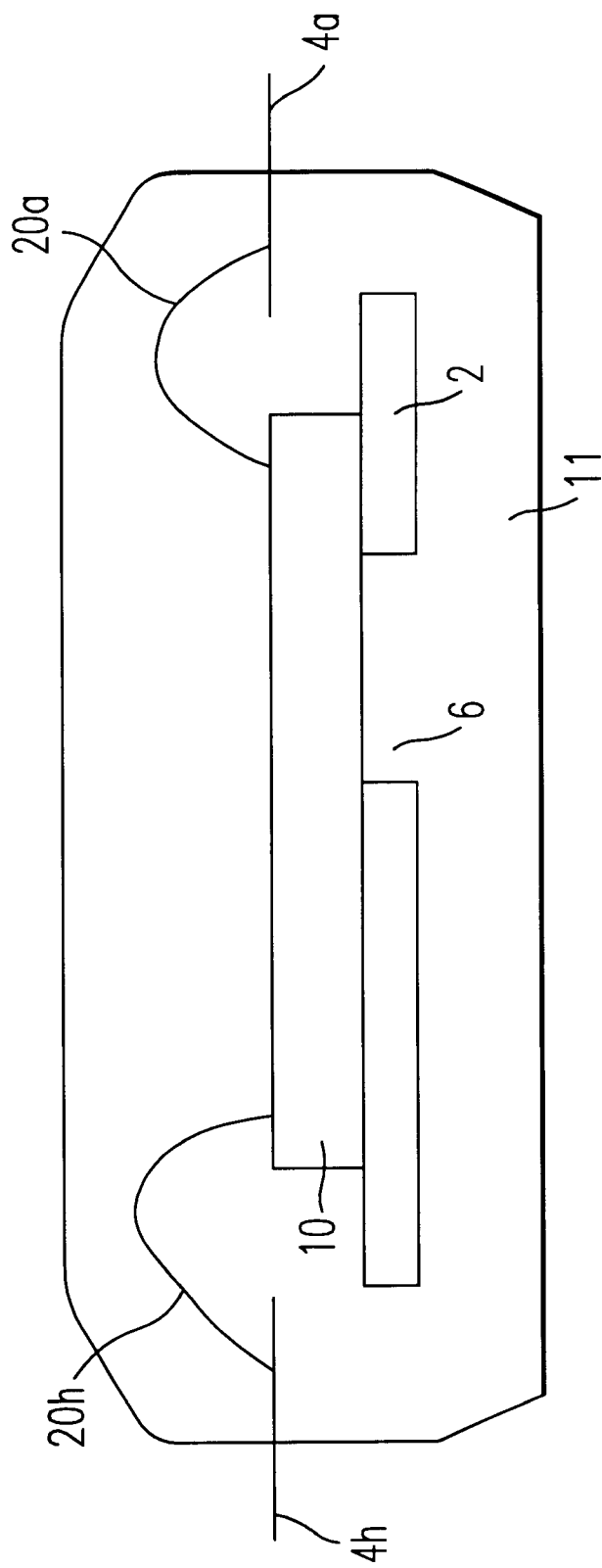
FIG. 1B shows a cross-sectional view of the semiconductor device shown in FIG. 1A.

Referring now to FIGS. 1A and 1B, there is shown a configuration of a high-frequency semiconductor device in accordance with one preferred embodiment of the present invention. FIG. 1B illustrates a cross-sectional structure of the semiconductor device along the line AA that passes through an opening or hole 6 of a "bed" plate 2 shown in FIG. 1A. The high-frequency semiconductor device embodying the present invention is a four-stage amplifier, which is configured including the bed plate 2 made of a metallic material along with pins 4a, 4b, . . . 4n and a microwave monolithic integrated circuit (MMIC) 10 as well as bonding wires 20a–20n. The four-stage amplifier is encased or "embedded" in a plastic package 11. In the illustrative embodiment, the bed 2 is provided with an opening or hole 6.

The MMIC 10 is mounted on the bed 2 and has field-effect transistors (FETS) $12_1$–$12_4$, matching circuits MC1–MC4 each including a capacitor and an inductor, and pads 14a–14l, 14n.

One matching circuit MC1 that has a capacitor MC1A and an inductor MC1b is connected to associative pads 14a, 14h. Another matching circuit MC2 having a capacitor MC2a and inductor MC2b is connected to a pad 14i. Another matching circuit MC3 including a capacitor MC3a and inductor MC3b is connected to a pad 14j. The remaining matching circuit, MC4, is formed of a capacitor MC4a and inductor MC4b and is connected to a pad 14k.

On the other hand, the first stage FET $12_1$ has a gate connected to the matching circuit MC1, a drain connected to the matching circuit MC2, and a source connected to the pad 14b. The second stage FET $12_2$ has a gate connected to the matching circuit MC2, a drain connected to the matching circuit MC3, and a source coupled to a pad 14c. The third stage FET $12_3$ has a gate connected to the matching circuit MC3, a drain coupled to the matching circuit MC4, and a source coupled to a pad 14e. The fourth stage FET $12_4$ has a gate connected to the matching circuit MC4 and also coupled to a pad 14f via a high-resistance element, a drain connected to pad 14n, and a source connected to pads 14g, 14l. An output of the high-frequency semiconductor device is derived from the drain node of FET $12_4$, that is, the pad 14n.

The pads 14a–14f are connected via the bonding wires 20a–20f to pins 4a–4f, respectively; the pads 14h–14k are connected via bonding wires 20h–20k to pins 4h–4k, respectively. The pad 14g is connected to the bed 2 via three bonding wires 20g; the pad 14l is coupled via four bonding wires 20l to the bed 2. As the bed 2 may typically be coupled to the ground power supply, those pins 4g, 4l, 4m coupled to this bed 2 are provided as GND pins.

Additionally, the pad 14n is coupled by a bonding wire 20n to an output pin 4n.

Accordingly, the pad 14g which is connected to the source of the final-stage FET $12_4$ that is nearest the source side and thus suffers from a problem of "parasitic" inductance—is directly connected to the bed 2 by the bonding wire 20g, whereas the pad 14l is directly coupled to the bed 2 via bonding wires 20l, 20m.

In the illustrative embodiment, the hole 6 provided in the bed 2 is disposed just beneath the matching circuit MCI to have a rectangular planar shape; simultaneously, hole 6 is sized so that it covers a specified area or region which immediately underlies the matching circuit MC1. It would be preferable that the size of this hole 6 be greater than a certain value equivalent to the dimension d of the element (in this embodiment, the matching circuit MC1) added with a value equal to twice of the thickness ds of a substrate constituting this MMIC 10—i.e. the hole size is greater than d+2ds.

With the hole 6 provided in the bed 2 of an element, the resultant capacitance between the bed 2 and the element of interest (matching circuit MC1 in this embodiment) becomes a fringing capacitance only, which makes it possible to greatly reduce the capacitance between the bed 2 and the element when compared to prior art devices. This in turn enables achievement of well stabilized operations as the amplifier circuitry without reducing the gain thereof.

It should be noted that it is preferable to employ electrically nonconductive or dielectric materials as the mounting material (adhesive) for rigidly securing the MMIC 10 to the bed 2. This can be said because even when the mount material behaves poorly, for example to seep and diffuse into the hole 6, the inside of hole 6 may remain electrically nonconductive due to the absence of any electrical objects therein.

Also while the illustrative hole is of almost the rectangular shape, the length of its shorter sides is substantially equal to the inductor MC1b's one side length plus the value 2·ds whereas the length of its longer sides is set at the matching circuit MC1's length in the longitudinal direction plus 2·ds. With such length setup, the resultant coupling capacitance between an input matching circuit and the bed 2 is reduced to the extend that it is approximately half of that obtained when no holes are present therein. This makes it possible to attain sufficient stability thereby enabling achievement of a gain nearly as high as the maximum gain that the device should inherently offer.

Figure 2:
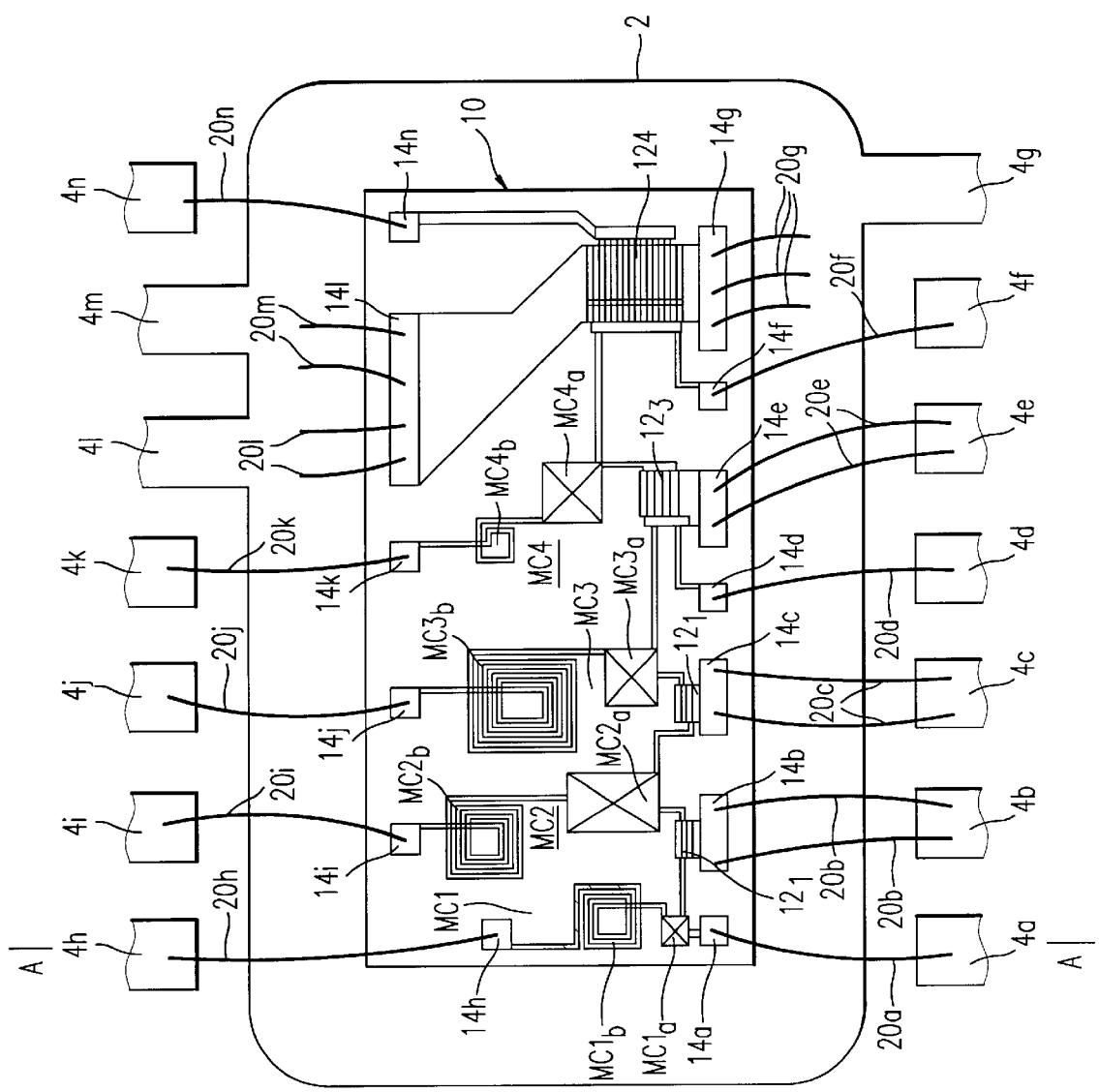
FIG. 2 illustrates a plan view of one typical prior art high-frequency semiconductor device.
Figure 3:
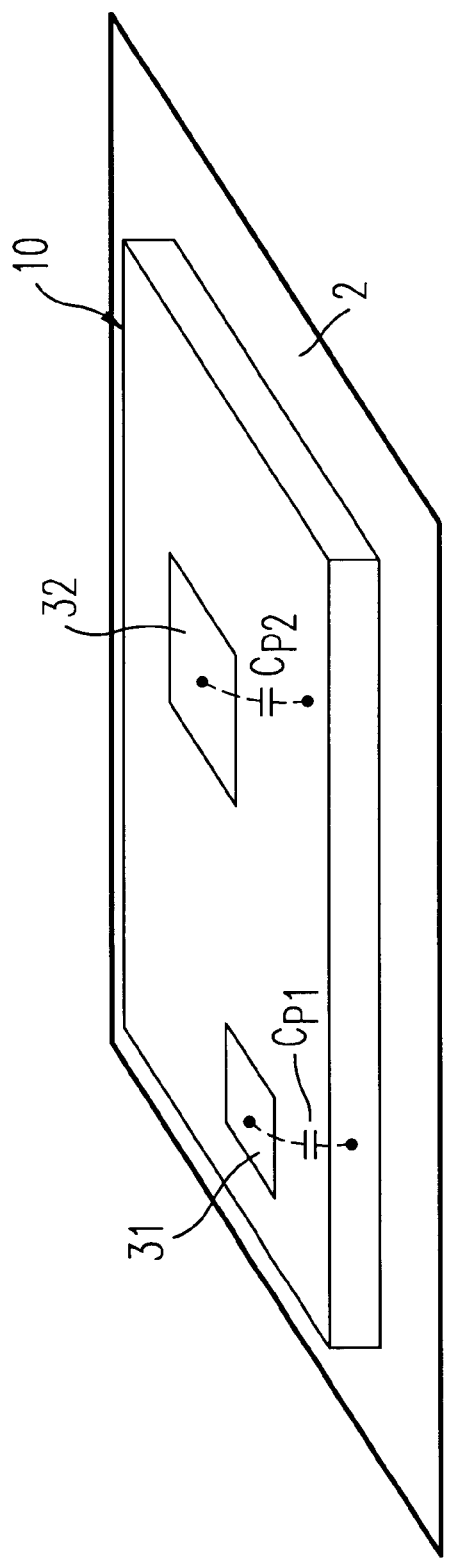
FIG. 3 shows a perspective view of a semiconductor device structure for explanation of capacitive coupling between adjacent elements with a bed laid therebetween.
Figure 4:
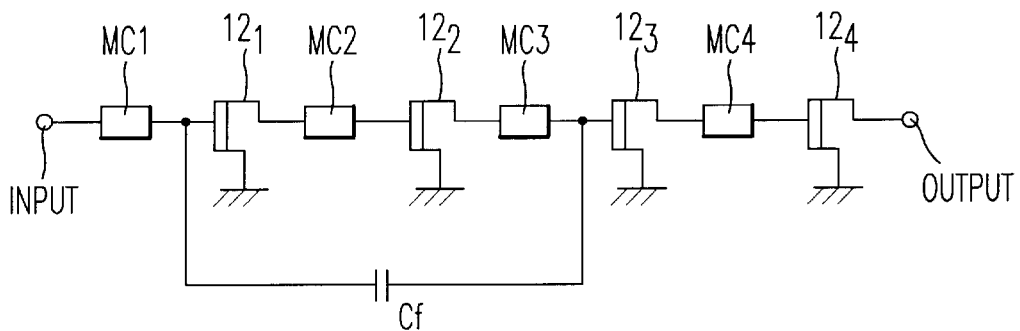
FIG. 4 shows equivalent circuitry of the high-frequency semiconductor device shown in FIG. 2.
Figure 5:
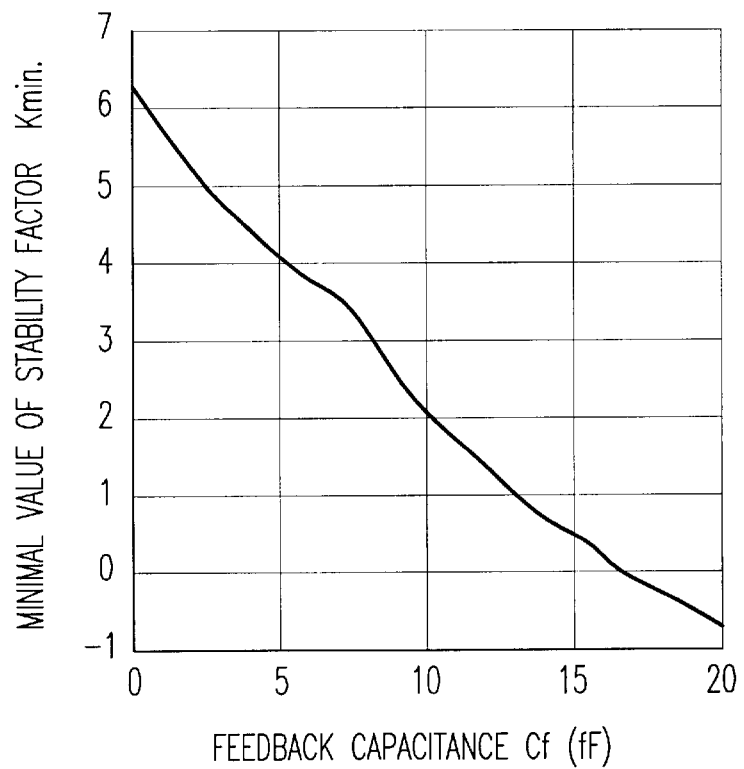
FIG. 5 is a graph showing a relation of a minimal value of stability factor versus a feedback capacitance in the device shown in FIG. 4.

An attempt was made to measure the gain by simulation with the high-frequency semiconductor device embodying the present invention used as a transmitter-side amplifier for use in portable and mobile digital cellular radiotelephone handsets based on a personal handy phone (PHP) system, also known as "PHS" in Japan, operable in 1.9 gigahertz (GHz) band, which demonstrated that the resulting gain was 42 dB. In contrast, an amplifier with the prior art amplifier configuration shown in FIG. 2 was as low as 36 dB in gain. This may encourage those skilled in the art to believe that the amplifier embodying the present invention offers higher gain than the prior art devices.

Figure 6:
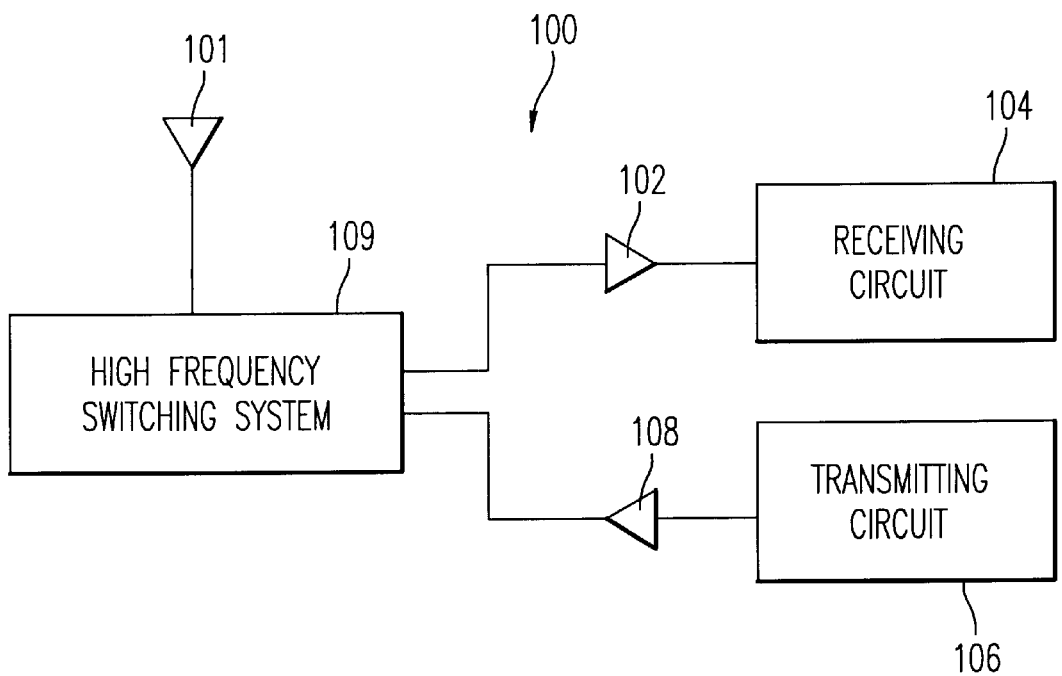
FIG. 6 illustrates a configuration of a radio transmitter and receiver (transceiver) device also embodying the invention.

An explanation will next be given of a case where the high-frequency semiconductor device embodying the present invention is applied to a radio transmitter/receiver (transceiver) device. One typical configuration of this device is shown in FIG. 6. The radio transmitter/receiver device 100 includes a high-frequency switch device 109, an antenna 101, a low-noise amplifier 102, a receiver circuit 104, a transmitter circuit 106, and a power amplifier 108.

At least one of the low-noise amplifier 102 and power amplifier 108 is designed employing the high-frequency semiconductor device of this invention. The high-frequency switch device 109 is operable to switch between reception and transmission of the antenna 101. A reception signal received at the antenna 101 passes through this high-frequency switch device 109 to reach the low-noise amplifier 102. This reception signal transferred is amplified at the low-noise amplifier 102, and is then sent forth toward the receiver circuit 106. At the receiver circuit 106 the reception signal transferred is processed thus obtaining desired reception.

A transmission operation of the radio transceiver 100 of FIG. 6 is as follows. The transmitter circuit 106 operates to produce a desired transmit signal, which is then sent to the power amplifier 108. At power amplifier 108 the transmit signal sent thereto is amplified to provide an amplified signal, which is passed via the high-frequency switch device 109 to the antenna 101. The transmit signal thus transferred is radiated over-the-air from the antenna 101 to the outside.

It must be noted that in the illustrative embodiment the bed 2 is provided with only one hole 6, the bed may alternatively be modified to have a plurality of holes where necessary. When this is done, these holes are provided in those regions underlying the matching circuits of the bed. Also while the above embodiment is arranged so that the hole 6 is provided covering the underlying region of one specific matching circuit on the input side of the initial-stage FET 121, similar effects and advantages are obtainable in cases where the hole is disposed in the underlying region of either a matching circuit on the input side of an FET of significant gain or a matching circuit on the output side thereof.

Although the foregoing description is devoted to one exemplary multi-stage amplifier, the present invention may also be effectively applicable to other similar device including, but not limited to, any type of MMIC with on-chip inductors and capacitors of large layout areas. In other words, providing the bed with one or more openings at specified portions underlying certain MMIC's on-chip elements that suffer from a capacitance coupling problem may avoid any undesired capacitive coupling through the bed, which in turn makes it possible to achieve the intended performance as high as possible.

Obviously, numerous modifications and variations of the present invention are possible in light of the above teachings. It is therefore to be understood that within the scope of the appended claims, the invention may be practiced otherwise than as specifically described herein.

What is claimed is:

1. A high-frequency semiconductor device comprising:
   a microwave monolithic integrated circuit including
      a circuit element having a first passive element section and a second passive element section each with at least one passive element contained therein, and
      a transistor having
         an input side connected to one of said first passive element section and said second passive element section,
         a gate connected to said first passive element section, and
         a drain connected to said second passive element section; and
   a bed mounted to said microwave monolithic integrated circuit, said bed being made of a conductive plate having at least one opening formed therein,
   wherein said opening in said bed being positioned to underlie the one of said first passive element section and said second passive element section.

2. The high-frequency semiconductor device as recited in claim 1, wherein:
   said transistor having an input said and an output side;
   said first passive element section being connected to said input side of said transistor and said second passive element section being connected to said output side of said transistor.

3. The high-frequency semiconductor device as recited in claim 1, wherein:
   said passive element being at least one of a capacitor and an inductor.

4. The high-frequency semiconductor device as recited in claim 1, wherein:
   said bed mounted to said microwave monolithic integrated circuit being sealed by a resin.

5. A high-frequency semiconductor device comprising:
   a microwave monolithic integrated circuit comprising
      an amplifier circuit including
         a cascade connection of a plurality of amplifying elements, each having
            a matching circuit, and
            a transistor with a gate connected to said matching circuit; and
   a bed mounted to said microwave monolithic integrated circuit and being made of a conductive plate having at least one opening formed therein, wherein
   one of said plurality of amplifying elements is an initial stage having an input side, and
   one of said at least one opening is positioned in said bed so as to underlie the matching circuit of the initial stage of said plurality of amplifying elements at said input side of said initial stage.

6. The device of claim 1, wherein the bed has a ground potential.

7. The high-frequency semiconductor device as recited in claim 5, wherein:
   said transistor having
      a gate,
      a drain,
      an input side, and
      an output side;
   the gate of said transistor being connected to said matching circuit corresponding with said transistor on the input side of said transistor; and
   the drain of said transistor being connected to said matching circuit corresponding with said transistor on the output side of said transistor.

8. The high-frequency semiconductor device as recited in claim 5, wherein:
   each of said plurality of said amplifying elements having an input side and an output side; and
   said opening being positioned in said bed so as to underlie the matching circuit corresponding to one of the plurality of amplifying elements with a maximal gain on at least one of the input side and the output side of said one of the plurality of amplifying elements with the maximal gain.

9. The high-frequency semiconductor device as recited in claim 5, wherein:
   each of said matching circuits having at least one passive element.

10. The high-frequency semiconductor device as recited in claim 9, wherein:

said at least one passive element being at least one of a capacitor and an inductor.

11. The high-frequency semiconductor device as recited in claim 5, wherein:
said bed mounted to said microwave monolithic integrated circuit being sealed by a resin.

12. The device of claim 5, wherein the bed has a ground potential.

13. A high-frequency semiconductor device comprising:
a microwave monolithic integrated circuit comprising
an amplifier circuit including
a cascade connection of a plurality of amplifying elements, each having
a matching circuit, and
a transistor with a gate connected to said matching circuit; and
a bed mounted to said microwave monolithic integrated circuit and being made of a conductive plate selectively having at least one opening formed therein under the matching circuit corresponding to the at least one of said plurality of amplifying elements, wherein
one of said plurality of amplifying elements is an initial stage having an input side, and
one of said at least one opening is positioned in said bed so as to underlie the matching circuit of the initial stage of said plurality of amplifying elements at said input side of said initial stage.

14. The high-frequency semiconductor device as recited in claim 13, wherein:
the transistor corresponding to the at least one of the plurality of amplifying elements having
a gate,
a drain,
an input side, and
an output side;
the gate of said transistor being connected to said matching circuit on the input side of said transistor; and
the drain of said transistor being connected to said matching circuit on the output side of said transistor.

15. The high-frequency semiconductor device as recited in claim 13, wherein:
each of said plurality of amplifying elements having an input side and an output side;
said opening being positioned in said bed so as to underlie the matching circuit corresponding to one of the plurality of amplifying elements with a maximal gain on at least one of the input side and the output side of said one of the plurality of amplifying elements with the maximal gain.

16. The high-frequency semiconductor device as recited in claim 13, wherein:
each of said matching circuits having at least one passive element.

17. The high-frequency semiconductor device as recited in claim 16, wherein:
said passive element being at least one of a capacitor and an inductor.

18. The high-frequency semiconductor device as recited in claim 13, wherein:
said bed mounted to said microwave monolithic integrated circuit being sealed by a resin.

19. The device of claim 13, wherein the bed has a ground potential.

20. A radio transmitter/receiver device comprising:
an antenna unit;
a high-frequency switch unit configured to switch between transmission and reception modes of operation for said antenna unit;
a first amplifier unit configured to amplify a reception signal sent from said high-frequency switch unit;
a receiver circuit unit configured to receive the reception signal as passed from said first amplifier unit;
a transmitter circuit unit configured to output a transmission signal; and
a second amplifier unit configured to amplify the transmission signal output from said transmitter circuit unit and configured to pass the transmission signal, after being amplified, toward said high-frequency switch unit, wherein
at least one of said first amplifier unit and said second amplifier unit having a high-frequency semiconductor device comprising,
a microwave monolithic integrated circuit including
a circuit element having a first passive element section and a second passive element section each with at least one passive element contained therein, and
a transistor having
an input side connected to one of said first passive element section and said second passive element section,
a gate connected to said first passive element section, and
a drain connected to said second passive element section; and
a bed mounted to said microwave monolithic integrated circuit, said bed being made of a conductive plate having at least one opening formed therein,
wherein said opening in said bed being positioned to underlie the one of said first passive element section and said second passive element section.

21. The device of claim 20, wherein the bed has a ground potential.

22. A radio transmitter/receiver device comprising:
an antenna unit;
a high-frequency switch unit configured to switch between transmission and reception modes of operation for said antenna unit;
a first amplifier unit configured to amplify a reception signal sent from said high-frequency switch unit;
a receiver circuit unit configured to receive the reception signal as passed from said first amplifier unit;
a transmitter circuit unit configured to output a transmission signal; and
a second amplifier unit configured to amplify the transmission signal output from said transmitter circuit unit and configured to pass the transmission signal, after being amplified, toward said high-frequency switch unit, wherein
at least one of said first amplifier unit and said second amplifier unit having a high-frequency semiconductor device comprising,
a microwave monolithic integrated circuit comprising
an amplifier circuit including
a cascade connection of a plurality of amplifying elements, each having
a matching circuit, and
a transistor with a gate connected to said matching circuit; and
a bed mounted to said microwave monolithic integrated circuit and being made of a conductive plate having at least one opening formed therein, one of said plurality of amplifying elements is an initial stage having an input side, and one of said at least one opening is positioned in said bed so as to underlie the matching circuit of the initial stage of said plurality of amplifying elements at said input side of said initial stage.

23. The device of claim 22, wherein the bed has a ground potential.

24. A radio transmitter/receiver device comprising:

an antenna unit;

a high-frequency switch unit configured to switch between transmission and reception modes of operation for said antenna unit;

a first amplifier unit configured to amplify a reception signal sent from said high-frequency switch unit;

a receiver circuit unit configured to receive the reception signal as passed from said first amplifier unit;

a transmitter circuit unit configured to output a transmission signal; and a second amplifier unit configured to amplify the transmission signal output from said transmitter circuit unit and configured to pass the transmission signal, after being amplified, toward said high-frequency switch unit, wherein at least one of said first amplifier unit and said second amplifier unit having a high-frequency semiconductor device comprising, a microwave monolithic integrated circuit comprising an amplifier circuit including a cascade connection of a plurality of amplifying elements, each having a matching circuit, and a transistor with a gate connected to said matching circuit; and a bed mounted to said microwave monolithic integrated circuit and being made of a conductive plate selectively having at least one opening formed therein under the matching circuit corresponding to the at least one of said plurality of amplifying elements, one of said plurality of amplifying elements is an initial stage having an input side, and one of said at least one opening is positioned in said bed so as to underlie the matching circuit of the initial stage of said plurality of amplifying elements at said input side of said initial stage.

25. The device of claim 24, wherein the bed has a ground potential.

* * * * *